(12) United States Patent
Tustaniwskyj et al.

(10) Patent No.: US 6,774,661 B1
(45) Date of Patent: Aug. 10, 2004

(54) INITIAL CONTACT METHOD OF PREVENTING AN INTEGRATED CIRCUIT CHIP FROM BEING THERMALLY DESTROYED, IN A TESTER, DUE TO A DEFECTIVE PRESSED JOINT

(75) Inventors: Jerry Ihor Tustaniwskyj, Mission Viejo, CA (US); James Wittman Babcock, Escondido, CA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 10/391,887

(22) Filed: Mar. 18, 2003

(51) Int. Cl.[7] .............................................. G01R 31/26
(52) U.S. Cl. ................................... 324/765; 324/158.1
(58) Field of Search .............................. 324/760, 765, 324/158.1; 165/61–66, 80.2, 104.33; 374/4; 361/688, 696, 697, 702; 62/3.1–3.3, 3.7

(56) References Cited

U.S. PATENT DOCUMENTS

| | | | | |
|---|---|---|---|---|
| 4,279,292 A | * | 7/1981 | Swiatosz | 165/61 |
| 5,006,796 A | * | 4/1991 | Burton et al. | 324/760 |
| 5,325,052 A | * | 6/1994 | Yamashita | 324/754 |
| 5,966,940 A | * | 10/1999 | Gower et al. | 62/3.3 |
| 6,522,156 B2 | * | 2/2003 | Tustaniwskyj et al. | 324/754 |
| 6,566,900 B2 | * | 5/2003 | Amick et al. | 324/760 |
| 6,617,868 B1 | * | 9/2003 | Needham | 324/760 |

* cited by examiner

*Primary Examiner*—Kamand Cuneo
*Assistant Examiner*—Russell M. Kobert
(74) *Attorney, Agent, or Firm*—Charles J. Fassbender; Mark T. Starr; Lise A. Rode

(57) ABSTRACT

An integrated circuit chip can be thermally destroyed in a tester due to a defective pressed joint with a temperature regulating component. A method which prevents such destruction begins with the step of maintaining the chip at one temperature while forcing the temperature regulating component to a different temperature, when the chip and the temperature regulating component are spaced apart in the tester. Next, the chip at its one temperature and the temperature regulating component at its different temperature are pressed together. Then a temperature change is sensed in either the chip or the temperature regulating component, during a time interval that begins when the temperature regulating component and the chip initially press together. Thereafter, electrical power is applied to the chip in the tester only if the temperature change, which is sensed by the sensing stop, meets a predetermined criteria.

15 Claims, 10 Drawing Sheets

FIG. 4

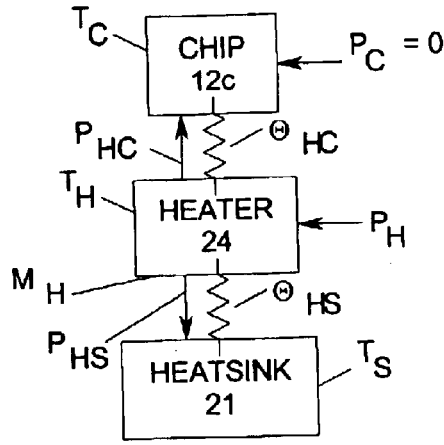

FIG. 5

EQ. 1 ⟹ $P_H = P_{HC} + P_{HS} + M_H \dot{T}_H$

EQ. 2 ⟹ $P_H = \left[\dfrac{T_H - T_C}{\Theta_{HC}}\right] + \left[\dfrac{T_H - T_S}{\Theta_{HS}}\right] + M_H \dot{T}_H$ EXP. 3 ⟹ CONSTANT $P_H$ ⟶ $\dot{T}_H = 0$ IN STEADY-STATE EXP. 4 ⟹ ABRUPTLY INCREASE $P_H$ ⟶ $\dot{T}_H > 0$ EXP. 5A ⟹ NON DEFECTIVE JOINT ⟶45a $\Theta_{HC}$ SMALL ⟶45b $\left[\dfrac{T_H - T_C}{\Theta_{HC}}\right]$ LARGE ⟶45c ↳ LESS INCREASE IN $\left[\dfrac{T_H - T_S}{\Theta_{HS}}\right] + M_H \dot{T}_H$ ⟶45d SMALL $\dot{T}_H$ EXP. 5B ⟹ DEFECTIVE JOINT ⟶46a $\Theta_{HC}$ LARGE ⟶46b $\left[\dfrac{T_H - T_C}{\Theta_{HC}}\right]$ SMALL ⟶46c ↳ MORE INCREASE IN $\left[\dfrac{T_H - T_S}{\Theta_{HS}}\right] + M_H \dot{T}_H$ ⟶46d LARGE $\dot{T}_H$

FIG. 9

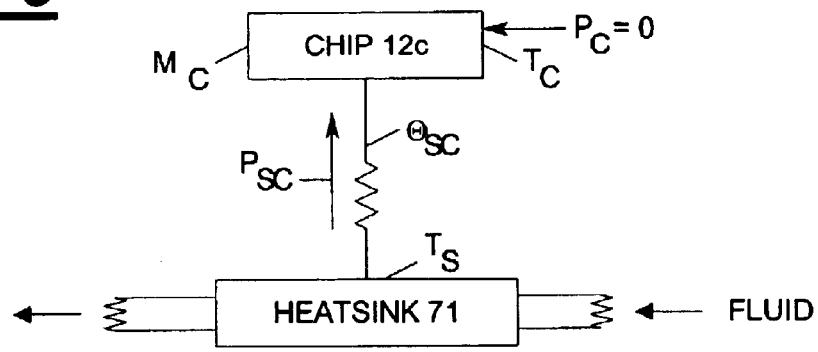

FIG. 10

EQ. 11 $\Longrightarrow$ $P_{SC} = M_C \dot{T}_C$

EQ. 12 $\Longrightarrow$ $\dfrac{T_S - T_C}{\Theta_{SC}} = M_C \dot{T}_C$

EXP. 13 $\Longrightarrow$ CONSTANT $T_S \longrightarrow \dot{T}_C = 0$

EXP. 14 $\Longrightarrow$ INCREASE $T_S \longrightarrow \dot{T}_C > 0$

EXP. 15A $\Longrightarrow$ NON DEFECTIVE JOINT $\xrightarrow{91}$ $\Theta_{SC}$ SMALL $\xrightarrow{92}$ LARGE $\dot{T}_C$ EXP. 15B $\Longrightarrow$ DEFECTIVE JOINT $\xrightarrow{93}$ $\Theta_{SC}$ LARGE $\xrightarrow{94}$ SMALL $\dot{T}_C$

INITIAL CONTACT METHOD OF PREVENTING AN INTEGRATED CIRCUIT CHIP FROM BEING THERMALLY DESTROYED, IN A TESTER, DUE TO A DEFECTIVE PRESSED JOINT

RELATED CASES

The present invention, has identified by the above title and docket number, is related to one other invention which has (Ser. No. 10/391,884 now pending) and is entitled "ABRUPT POWER CHANGE METHOD OF PREVENTING AN INTEGRATED CIRCUIT CHIP FROM BEING THERMALLY DESTROYED, IN A TESTER, DUE TO A DEFECTIVE PRESSED JOINT". Patent applications on both of these inventions were filed concurrently on Mar. 18, 2003, and they have one common Detailed Description.

BACKGROUND OF THE INVENTION

The present invention relates to methods, that can be performed automatically in a chip tester, which prevent a chip from being thermally destroyed by a defective pressed joint between the chip and a temperature regulating component within the chip tester. As used herein, the term "chip" means any of the following items: 1) an integrated circuit that is encapsulated in a package, such as a plastic or ceramic package; 2) an integrated circuit by itself without an encapsulating package; and 3) the integrated circuit of items 1) or 2) which is mounted on a substrate.

In the prior art, the structure of one chip tester is disclosed in U.S. Pat. No. 6,325,662. All of the teachings of that patent are herein incorporated by reference; however, FIGS. 2 and 2A in the patent show a portion of the chip tester that is most relevant to the present invention. Those figures are reproduced herein as FIGS. 1 and 2, and they are labeled prior art.

The above prior art chip tester includes a frame that has four vertical members, two of which are shown herein in FIGS. 1 and 2 as items 11$e$ and 11$f$. These members support multiple sets of: a chip holding subassembly, a power converter subassembly, a temperature regulating subassembly, and a pressing mechanism.

Each chip holding subassembly includes components 12$a$–12$d$. From one to fourteen of these chip holding subassemblies are in the frame. Component 12$a$ is a printed circuit board which has one face 12$a$-1 and an opposite face 12$a$-2. Attached to face 12$a$-1 are N sockets 12$b$, each of which holds one IC chip 12$c$ that is to be tested. Here, N is any desired number, such as sixteen or thirty, for example. Attached to face 12$a$-2 are N sets of electrical contacts 12$d$, and each set carries all of the electrical power and all signals for one of the chips 12$c$. Each socket 12$b$ is connected to one set of contacts 12$d$ by microscopic conductors (not shown) that pass thru the printed circuit board 12$a$.

Each power converter subassembly includes components 13$a$–13$c$. A separate power converter subassembly is supported by the frame above each chip holding subassembly. Component 13$a$ is a printed circuit board which has one face 13$a$-1 and an opposite face 13$a$-2. Attached to face 13$a$-1 are N sets of electrical contacts 13$b$, each of which mates with one set of the contacts 12$d$ on the chip holding subassembly. Attached to face 13$a$-2 are N DC-DC power converters 13$c$. Each power converter 13$c$ supplies power to one set of the contacts 13$b$, and it is connected to those contacts by microscopic conductors (not shown) that pass through the printed circuit board 13$a$.

Each temperature regulating subassembly includes components 14$a$–14$d$. A separate temperature regulating subassembly is in the frame below each chip holding assembly 12. Component 14$a$ is a flat rigid plate which has one face 14$a$-1 and an opposite face 14$a$-2. Attached to face 14$a$-2 are N springy components 14$b$, and each springy component 14$b$ holds one temperature regulating component 14$c$ such that it is aligned with one chip 12$c$ in the chip holding assembly 12.

The temperature regulating component 14$c$ can be of a type which removes heat from the chips 12$c$ by conduction, such as a heat sink; or it can be of a type which adds heat to the chips 12$c$ by conduction, such as an electric resistive heater; or it can be a combination of both types. Several stops 14$d$ are attached to the face 14$a$-2, and they are aligned with the spaces between the sockets 12$b$ in the chip holding assembly. These stops 14$d$ limit the force with which the temperature regulating components 14$c$ can be pressed against the chips 12$c$.

Each pressing mechanism includes components 15$a$–15$g$. Component 15$a$ is a rail which is rigidly attached to the frame columns 11$e$ and 11$f$. This rail 15$a$ lies below the temperature regulating subassembly and is parallel to face 14$a$-1 of the plate 14$a$. Components 15$b$ and 15$c$ are a pair of arms that are coupled together with a pivotal joint 15$d$ which presses against face 14$a$-1 of the plate 14$a$. The arms 15$b$ and 15$c$ also have slidable joints 15$e$ and 15$f$ which slide on the rail 15$a$. Component 15$g$ is a spring which is coupled between the slidable joint 15$f$ and the frame. All of the components 15$b$–15$g$ are duplicated in the pressing mechanism as shown in FIG. 1.

In operation, an actuator slides the arms 15$b$ on the rail 15$a$ to either an "open" position or a "closed" position. When the arms 15$b$ are in the open position, the angle "A" between the arms 15$b$ and 15$c$ is large, and so the pivotal joints 15$d$ have moved down. Consequently, each chip holding subassembly is spaced apart from its corresponding power converter subassembly and corresponding temperature regulating subassembly, as is shown in FIG. 1.

Conversely, when the arms 15$b$ are in the closed position, the angle "A" between the arms 15$b$ and 15$c$ is small, and so the pivotal joints 15$d$ have moved up. Consequently, each chip holding subassembly is pressed against its corresponding power converter subassembly and corresponding temperature regulating subassembly, as is shown in FIG. 2.

To test a set of chips with the tester of FIGS. 1 and 2, the following sequence of steps conventionally is performed. First, while the arms 15$b$ are in the open position, each chip holding subassembly is placed in the tester between its corresponding power converter subassembly and corresponding temperature regulating subassembly. Next, the arms 15$b$ are moved to the closed position, and in that position electrical power and test signals are sent to all of chips 12$c$. While this occurs, the temperature of the chips 12$c$ is regulated by the temperature regulating components 14$c$. Then, after all of the test signals have been sent to the chips 12$c$, the electrical power to chips is turned off, the arms 15$b$ are moved back to the open position, and each chip holding subassembly is removed from the tester.

However, a major drawback with the above sequence of steps is that when the arms 15$b$ are in the closed position, a defect may be present in one or more of the pressed joints that occur between the chips 12$c$ and the corresponding temperature regulating components 14$c$. Due to such a defect, the thermal resistance through the pressed joint can be so large that the temperature regulating component 14$c$ is not able to prevent the chip 12$c$ from overheating when electrical power is applied to chip.

One particular cause for a pressed joint being defective is that a chip 12$c$ has been improperly inserted in its socket 12b. Another cause is that the surface of a temperature regulating component 14c which contacts a chip 12c has been oxidized by extended use, and thereby became too resistant. Still another cause is that a film of thermally resistant debris has been accidentally deposited on the surface of a chip 12c or the surface of a temperature regulating component 14c that gets pressed together.

The above problem is most serious for the latest state-of-the-art chips which dissipate extremely high levels of electrical power. Some of the latest chips dissipate over two-hundred watts of power, and at that power level a chip will rapidly destroy itself if it is not properly cooled. Starting at about 150 degrees centigrade, various materials that make up the chip can either improperly diffuse, or soften, or melt.

Accordingly, a primary object of the present invention is to overcome the above problem.

BRIEF SUMMARY OF THE INVENTION

The present invention is a method of preventing the thermal destruction of an integrated circuit chip in a tester that includes a temperature regulating component for contacting said chip through a pressed thermal joint, which could be defective. This method begins with the step of maintaining the chip at an ambient temperature while forcing the temperature regulating component to a different temperature, when the chip and the temperature regulating component are spaced apart in the tester. Then, the chip at its ambient temperature and the temperature regulating component at its different temperature are pressed together. Next, a temperature change is sensed in either the chip or the temperature regulating component, during a time interval that begins when the temperature regulating component and the chip initially press together. Thereafter, electrical power is applied to the chip in the tester only if the temperature change, which is sensed by the sensing stop, meets a predetermined criteria. This method is based on certain thermodynamic principles which are explained in the Detailed Description.

In one particular version of the above method, the sensing step is performed by an electronic sensor in the temperature regulating component; and, electrical power is applied to the chip only if the temperature change, which is sensed by the sensing step, is larger than a preset limit. In one other particular version, the sensing step is performed by an electronic sensor in the chip; and, electrical power is applied to the chip only if the temperature change, which is sensed by the sensing step, is larger than a preset limit.

In another particular version, the step of forcing the temperature regulating component to a different temperature is performed by including a hollow heatsink in the temperature regulating component and passing a fluid at a constant temperature through the hollow heatsink. In still another particular version, the step of forcing the temperature regulating component to a different temperature is performed by including an electric heater in the temperature regulating component and passing a current with a constant magnitude through the electric heater.

BRIEF DESCRIPTION OF THE DRAWINGS

FIG. 4 is a thermodynamic schematic diagram which represents a portion of the modified chip tester of FIG. 3.

FIG. 5 is a set of thermodynamic equations and expressions which are derived from FIG. 4 and which explain how the FIG. 3 modification works.

FIG. 9 is a thermodynamic schematic diagram which represents a portion of the modified chip tester of FIG. 8.

FIG. 10 is a set of thermodynamic equations and expressions which are derived from FIG. 10 and which explain how the FIG. 8 modification works.

DETAILED DESCRIPTION

Figure 1:
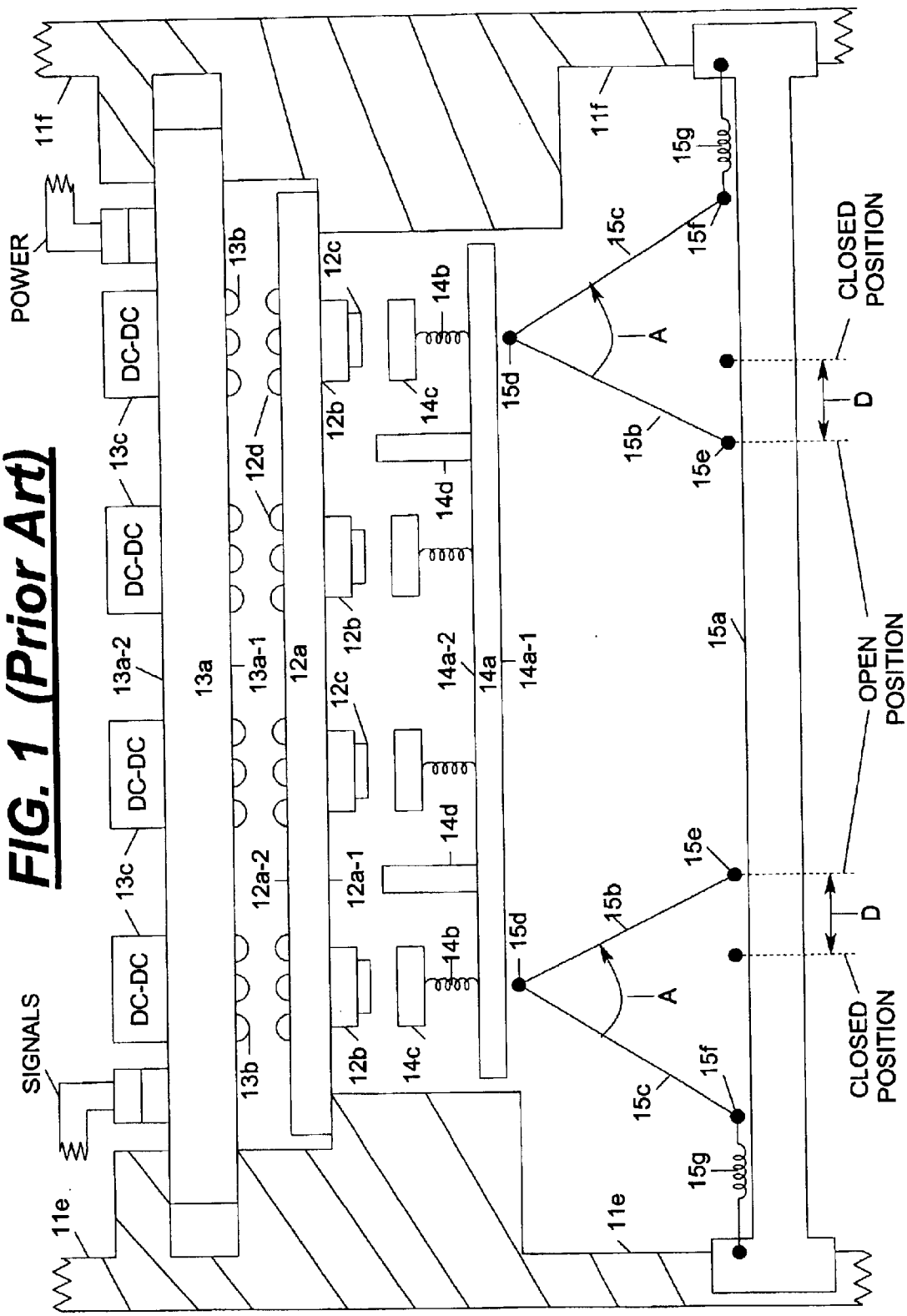
FIG. 1 shows a prior art chip tester in one particular state of operation.
Figure 2:
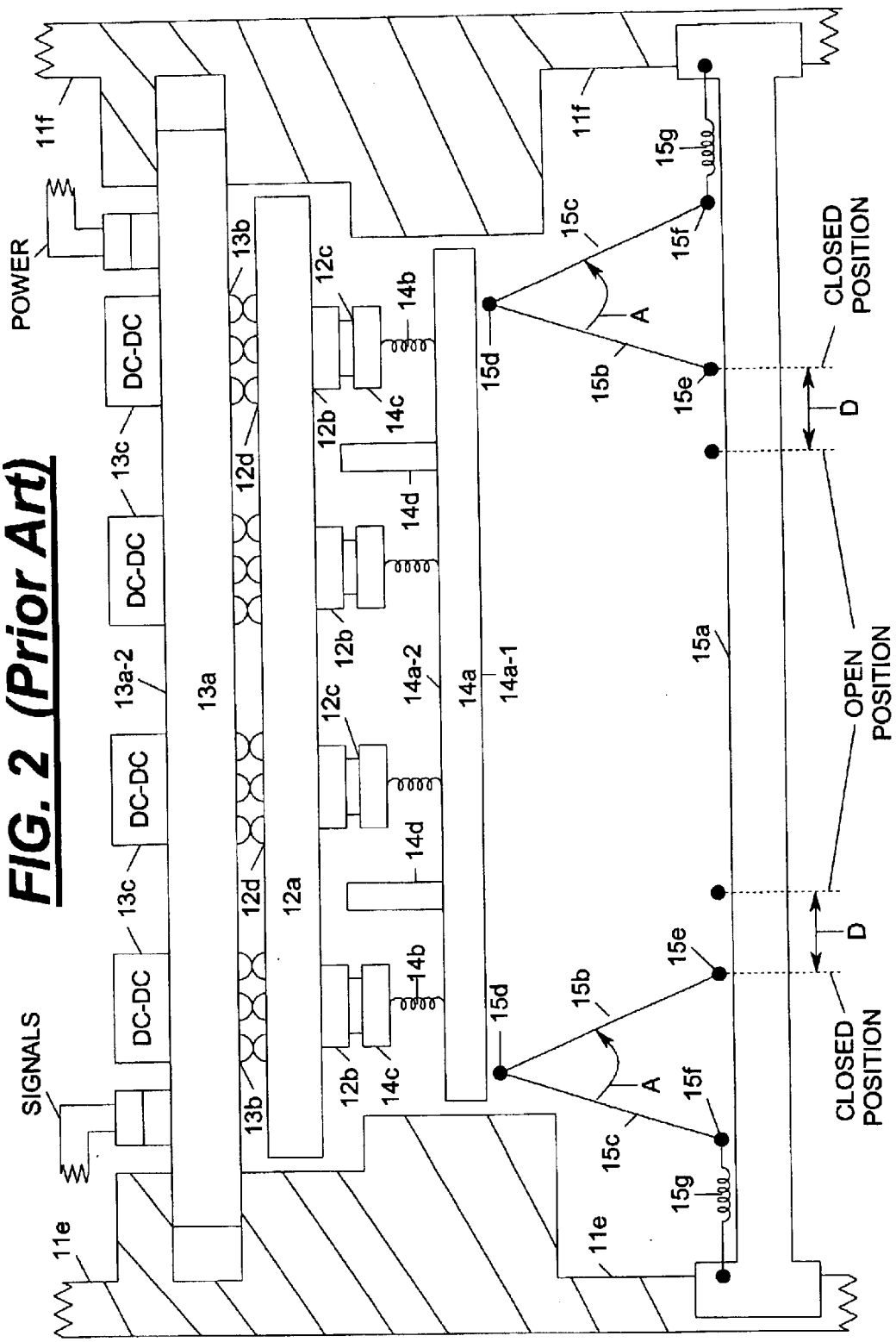
FIG. 2 shows the prior art chip tester of FIG. 1 in a different state of operation.
Figure 3:
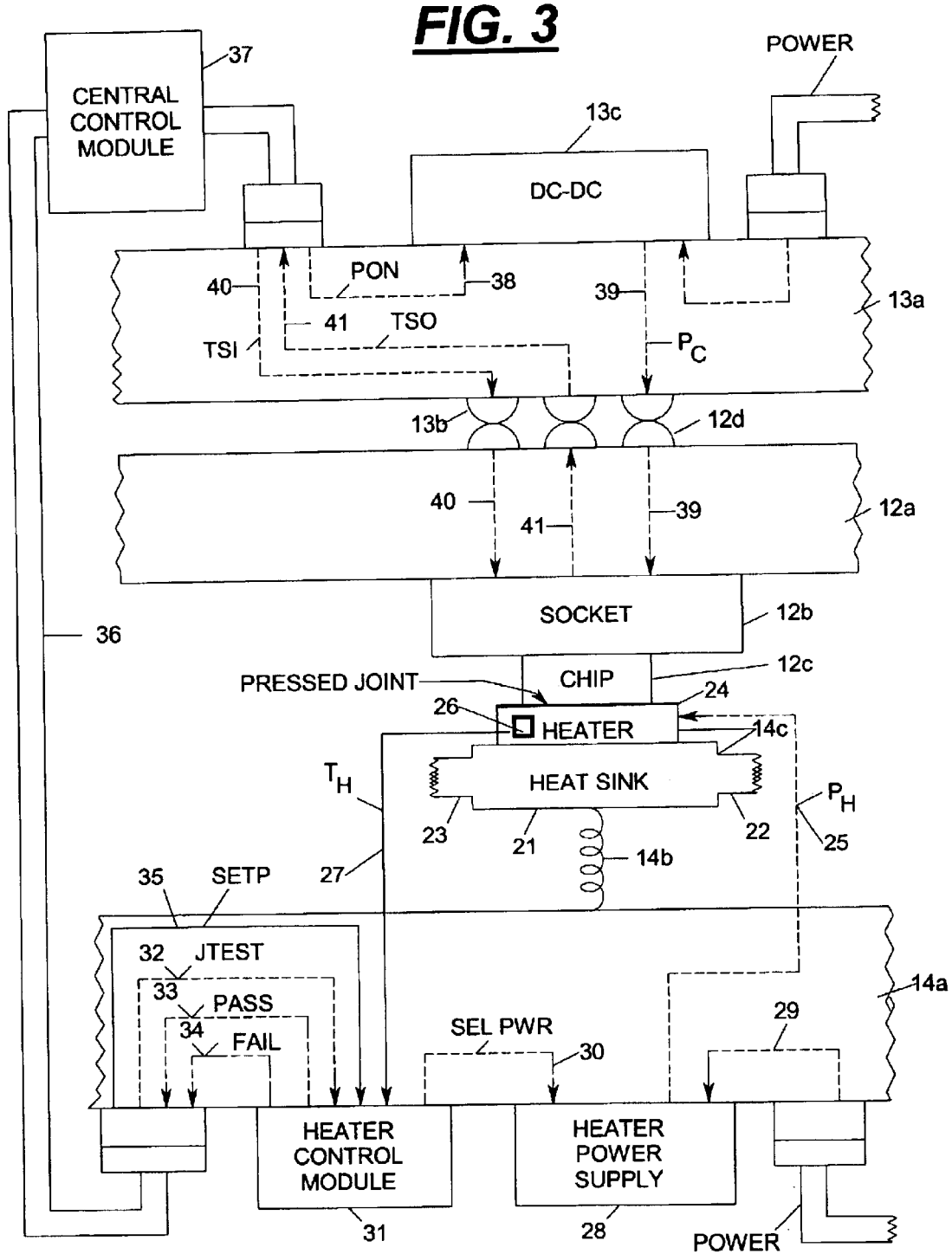
FIG. 3 shows a modification that is incorporated into the prior art chip tester of FIGS. 1 and 2 which enables the present invention to be performed.

Referring now to FIG. 3, it shows a modification that is incorporated into the prior art chip tester of FIGS. 1 and 2 which enables the present invention to be performed. All of the components that are in FIG. 3, but are not in FIGS. 1 and 2, are identified below in TABLE 1. All other components in FIG. 3 have the same reference numerals that they have in FIGS. 1 and 2.

TABLE 1

| Number | Component |
|---|---|
| 21, 22, 23 | Component 21 is a hollow heatsink which has an input port 22 and an output port 23. A constant temperature liquid (not shown) passes from the input port to the output port. |
| 24, 25 | Component 24 is a thin flat electric heater. Electrical power is sent to this heater on conductors 25. |
| 26, 27 | Component 26 is an electronic temperature sensor which is integrated into the heater 24. This sensor generates signals on conductors 27 which indicate the temperature of the heater 24. |
| 28, 29, 30 | Component 28 is a variable power supply for the heater 24. Electrical power is received by the power supply on conductors 29 from an external source. A signal SKLPWR on conductors 30 selects the amount of power that is sent from the power supply 28 to heater 24. |

TABLE 1-continued

| Number | Component |
|---|---|
| 31 | Component 31 is a control module for heater 24. This control module has a "normal" mode of operation and a "joint-test" mode of operation, each of which is. described later. |
| 32, 33, 34 | Component 32 is a conductor which carries a JTEST signal to control module 31. In response to that signal, module 31 enters the joint-test mode of operation. The results of the joint-test are indicated by a PASS signal on conductor 33, or a FAIL signal on conductor 34. |
| 35 | Component 35 is a set of conductors which carry signals SETP to the control module 31. These signals indicate a set-point temperature for the normal operating mode. |
| 36 | Component 36 is a cable which includes the conductors 32–35. |
| 37 | Component 37 is a central control module for the entire tester of FIGS. 1–3. How this module operates is described later. |
| 38, 39 | Component 38 is a conductor which carries a PON signal from the central control module 37 to the DC-DC converter 13c. In response to that signal, the DC-DC converter 13c sends power on a conductor 39 to chip 12c. |
| 40, 41 | Component 40 is a set of conductors which carry test signals TSI into the chip 12c from the central control module 37. Component 41 is a set of conductors which carry test signals TSO out from the chip 12c to the central control module 37. |

In FIG. 3, the above components 21–41 are only shown once for a single chip 12c in a single socket 12b on a single printed circuit board.6B.χa. However, to incorporate the modification of FIG. 3 into the prior art tester of FIGS. 1 and 2, all of the components 21–35 and 38–41 are repeated for each socket 12b on each printed circuit board 12a.

Now, in operation, the above modified tester performs the following sequence of steps. First, while the arms 15b are in the open position, as shown in FIG. 1, each chip holding subassembly 12a–12d is placed in the tester between its corresponding power converter subassembly and corresponding temperature regulating subassembly. Next, the arms 15b are moved to the closed position in which each chip 12c forms a pressed joint with a heater 24. One such joint in shown in FIG. 3. Then, before any electrical power is applied to the chips 12c by the DC-DC converters 13c, a joint test is performed on each pressed joint between the chips 12c and the heaters 24.

To start the above joint test, the central control module 37 sends the JTEST signal over the conductors 32 to each heater control module 31. In response, each heater control module 31 directs its heater power supply 28 to send electrical power to its heater 24 with a magnitude that is initially constant at one level and then abruptly changes to a different constant level. These two power levels are specified by the SELPWR signals on the conductors 30.

Then, during a predetermined time interval that begins with the above abrupt change in heater power, each heater control module 31 senses the amount by which the temperature of its heater 24 changes. The instantaneous temperature of a heater 24 is indicated by the signals from the heater's sensor 26. The change in temperature is obtained by sampling the signals from sensor 26 at the beginning and end of the predetermined time interval, and taking the magnitude of the difference between the two samples. Preferably, the time interval in which the sampling occurs is less than one second. For example, in one actual embodiment, the time interval was only 250 milliseconds.

Next, each heater control module 31 compares the above change in heater temperature that it sensed to a limit value. If the sensed change in heater temperature exceeds the limit value, then the heater control module 31 sends the FAIL signal back to the central control module 37. Otherwise, the heater control module 31 sends the PASS signal back to the central control module 37.

When the heater control module 31 for a particular chip sends the FAIL signal, then the central control module 37 does not test that chip. In particular, the central control module 37 does not send the PON signal to the DC-DC converter 13c for the chip, and so the chip does not receive any electrical power. This prevents the chip from thermally destroying itself due to a defective pressed joint with its heater 24.

Conversely, when the heater control module 31 for a particular chip 12c sends the PASS signal, then the central control module 37 proceeds to test that chip. To do that, the central control module 37 first sends the PON signal to the DC-DC converter 13c for the chip. In response, the DC-DC converter 13c sends electrical power PC to the chip. Thereafter, the central control module 37 sends the test signals TSI to the chip and receives the test signals TSO as a response.

While the above testing of the chip 12c occurs, the heater control module 31 operates in the normal mode. There, the heater control module 31 attempts to keep the heater 24 at the set-point temperature even though the chip 12c dissipates an amount of power that varies with the test signals TSI and TSO. If the temperature of the heater 24 drops below the set-point, then the heater control module 31 increases the electrical power to the heater. Conversely if the temperature of the heater 24 rises above the set-point, then the heater control module 31 decreases the electrical power to the heater.

After all of the test signals TSI have been sent, then the central control module 37 removes electrical power from all of the chips 12c in the tester. To do that, the central control module 37 stops sending the PON signal to each DC-DC converter 13c. Next, the arms 15b are moved to the open position as shown in FIG. 2. Then, any chips 12c which failed the joint test can be removed from their sockets 12b and saved for re-testing after the cause of the failed joint test is determined and corrected. Also, all chips 12c which passed both their joint test and their chip test can be sold to customers.

Turning now to FIGS. 4 and 5, the technical principles on which the above joint test is based will be described. To begin, reference should be made to FIG. 4 which is a thermodynamic schematic diagram of the chip 12c, the electric heater 24, and the heatsink 21 in FIG. 3. This schematic diagram contains several symbols, and the meaning of each symbol is described below in TABLE 2.

TABLE 2

| SYMBOL | MEANING |
| --- | --- |
| $\theta_{HC}$ | This is the thermal resistance between the heater 24 and the chip 12c. |
| $\theta_{HS}$ | This is the thermal resistance between the heater 24 and the heatsink 21. |
| $P_H$ | This is the electrical power that is sent to the heater 24. |
| $P_{HC}$ | This is the thermal power that is transferred between the heater 24 and the chip 12c. A positive value indicates that thermal power flows into the chip 12c; a negative value indicates that thermal power flows out of the chip 12c. |
| $P_{HS}$ | This is the thermal power that is transferred between the heater 24 and the heatsink 21. A positive value indicates that thermal power flows into the heatsink 21; & negative value indicates that thermal power flows out of the heatsink 21. |
| $P_C$ | This is the electrical power which is sent to the chip 12c. This power equals zero during the above described joint test. |
| $T_H$ | This is the temperature of the heater 24. |
| $T_C$ | This is the temperature of the chip 12c. |
| $T_S$ | This is the temperature of the heatsink 21. |
| $M_H$ | This is the thermal mass of the heater 24. |

Using the above symbols of TABLE 2 and the schematic diagram of FIG. 4, equation 1 of FIG. 5 can be written. Equation 1 says that the electrical power $P_H$ which is put into the heater 24 gets partitioned into three parts. One part $P_{HC}$ flows to the chip 12c, another part $P_{HS}$ flows to the heatsink 21, and the remaining part causes the temperature of the heater to change.

Next, equation 2 of FIG. 5 is obtained by replacing $P_{HC}$ and $P_{HS}$ in equation 1 with equivalent terms. The equivalent term for $P_{HS}$ is $(T_H-T_C) \div \theta_{HC}$, and the equivalent term for $P_{HS}$ is $(T_H-T_S) \div \theta_{HS}$.

Next, expression 3 of FIG. 5 says that when the electrical power $P_H$ in equation 2 is kept at one constant level, then the heater temperature in equation 2 reaches a steady state where it stays constant. By comparison, expression 4 of FIG. 5 says that when the electrical power $P_H$ in equation 2 is abruptly increased from one constant level to a different level, then the heater temperature in equation 2 changes at a positive rate.

Suppose now that no defect exists in the pressed joint between the chip 12c and the heater 24 of FIGS. 3 and 4. In that case, the thermal resistance $\theta_{HC}$ in equation 2 will be relatively small. This is indicated by the arrow 45a in expression 5A. Conversely, if a defect does exist in the pressed joint between the chip 12c and the heater 24, then the thermal resistance $\theta_{HC}$ in equation 2 will be relatively large as is indicated by the arrow 46a in expression 5B.

Now, if $\theta_{HC}$ in equation 2 is small, then the power term $(T_H-T_C) \div \theta_{HC}$ in equation 2 will be large. This is because the denominator of that power term is small. This is indicated by the arrow 45b in expression 5A.

Also, if the power term $(T_H-T_C) \div \theta_{HC}$ in equation 2 is large, then the two right-most terms in equation 2 will be small. This is because the heater power $P_H$ minus the power term $(T_H-T_C) \div \theta_{HC}$ equals the two right-most terms of equation 2. This is indicated by the arrow 45c in expression 5A.

Further, if the two right-most terms of equation 2 are small, then the rate of change of heater temperature will be small. This is because the rate of change of heater temperature is in the right-most term of equation 2. This is indicated by the arrow 45d in expression 5A.

Conversely, if $\theta_{HC}$ in equation 2 is large, then the power term $(T_H-T_C) \div \theta_{HC}$ in equation 2 will be small. This is because the denominator of that power term is large. This is indicated by the arrow 46b in expression 5B.

Also, if the power term $(T_H-T_C) \div \theta_{HC}$ in equation 2 is small, then the two right-most terms in equation 2 will be large. This is because the heater power $P_H$ minus the power term $(T_H-T_C) \div \theta_{HC}$ equals the two right-most terms of equation 2. This is indicated by the arrow 46c in expression 5B.

Further, if the two right-most terms of equation 2 are large, then the rate of change of heater temperature will be large. This is because the rate of change of heater temperature is in the right-most term of equation 2. This is indicated by the arrow 46d in expression 5B.

Figure 6:
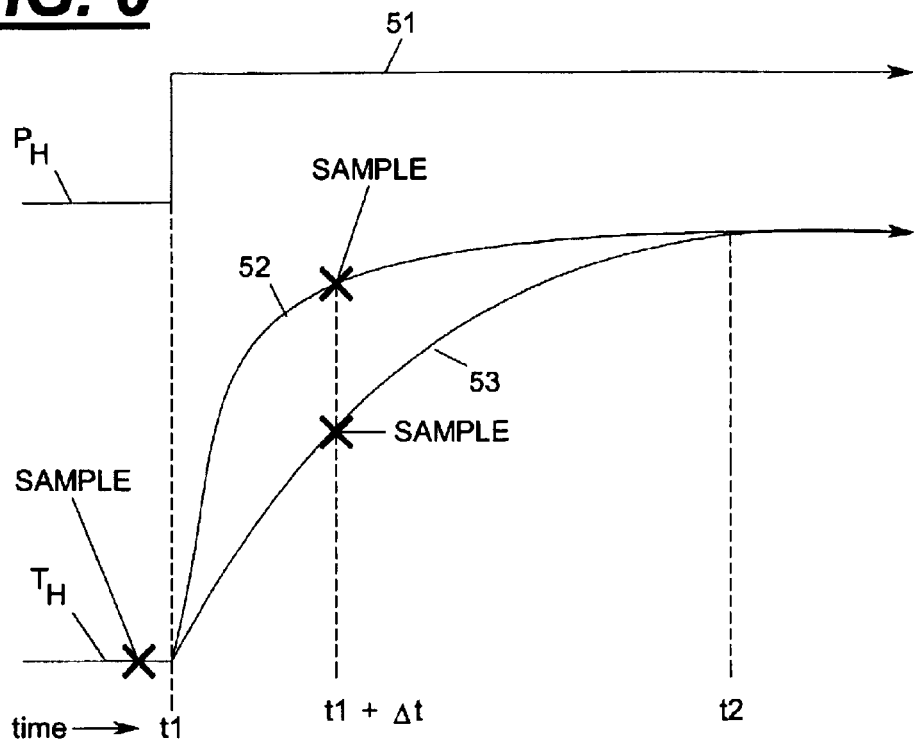
FIG. 6 is a set of curves that graphically illustrate one particular version of the present invention.

Next, reference should be made to FIG. 6 which shows a set of curves that graphically illustrate the above points. In FIG. 6, curve 51 shows the heater power $P_H$ as a function of time, and two curves 52 and 53 show the heater temperature $T_H$ as a function of time. These curves are for the structure of FIG. 3.

Prior to time t1 in FIG. 6, the heater power $P_H$ is constant and the heater temperature $T_H$ has reached a constant steady-state. Then, at time t1, the heater power $P_H$ is abruptly increased to a different constant level.

In response to the above power increase, the heater temperature $T_H$ increases and eventually reaches a new constant steady-state. However, the rate at which the heater temperature increases depends on whether the pressed joint between the heater 24 and chip 12c is defective or non-defective, as was explained above in conjunction with the equations of FIG. 5.

If the pressed joint is defective, then the rate at which the heater's temperature $T_H$ increases is large. This is shown by curve 52. If the pressed joint is not defective, then the rate at which the heater's temperature increases is small. This is shown by curve 53.

To sense whether the pressed joint is defective or not, the heater temperature is first sampled in the steady state prior to time t1. Subsequently, the heater temperature is sampled at time t1+Δt. Then the first sample is subtracted from the second sample, and the difference is compared to a limit value. If the difference exceeds the limit value, then the pressed joint is defective.

Preferably, the time t1+Δt at which the heater temperature is sensed for the method of FIGS. 3–5 occurs when the difference between the curves 52 and 53 is at or near a maximum value. Here, t1 is when the heater power $P_H$ is abruptly increased.

One preferred method of preventing a chip from being thermally destroyed in a tester, due to a defective pressed joint, has now been described in detail. Next, a variation to that particular method will be described with reference to FIG. 7.

Figure 7:
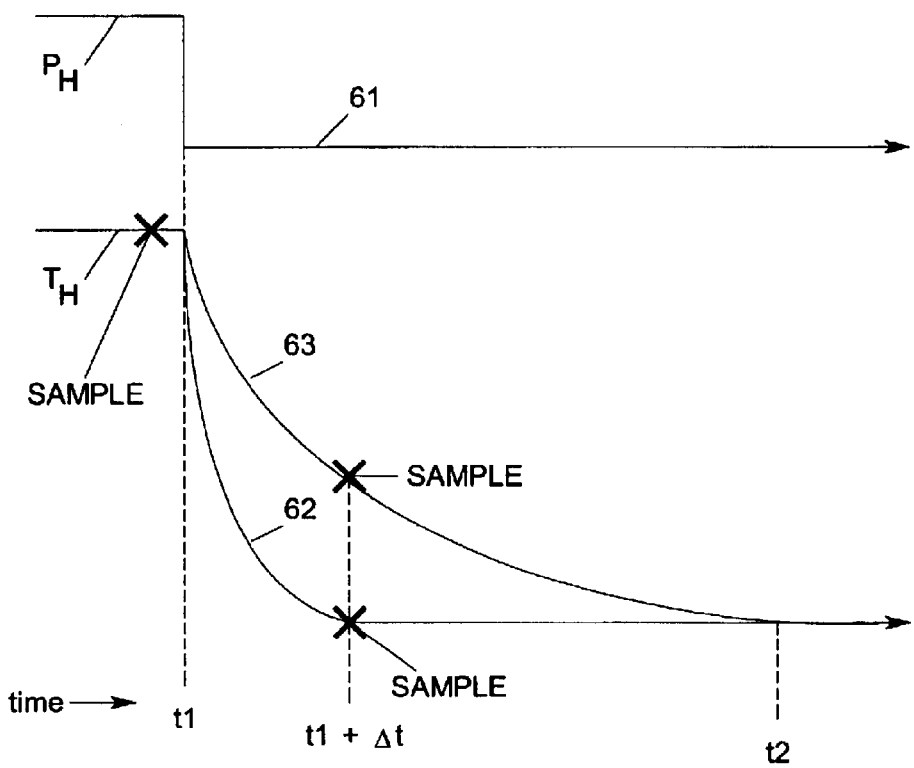
FIG. 7 is a set of curves that graphically illustrate another particular version of the present invention.

In FIG. 7, curve 61 shows the heater power $P_H$ as a function of time, and two curves 62 and 63 show the heater temperature $T_H$ as a function of time. These curves again are for the structure of FIG. 3.

Prior to time t1 in FIG. 7, the heater power $P_H$ is constant and the heater temperature $T_H$ has reached a constant steady-state. Then, at time t1, the heater power $P_H$ is abruptly decreased to a different constant level.

In response to the above power decrease, the heater temperature $T_H$ decreases and eventually reaches a new constant steady-state. However, the rate at which the heater temperature decreases depends on whether the pressed joint between the heater 24 and chip 12c is defective or non-defective.

If the pressed joint is defective, then the rate at which the heater temperature $T_H$ decreases is large, and this is shown by curve 62. If the pressed joint is not defective, then the rate at which the heater temperature decreases is small, and this is shown by curve 63.

To sense whether the pressed joint is defective or not, the heater temperature is sampled in the steady-state prior to time t1. Subsequently the heater temperature is sampled at time t1+Δt. Then the second sample is subtracted from the first sample, and the difference is compared to a limit value. If this difference exceeds the limit value, then the pressed joint is defective.

Figure 8:
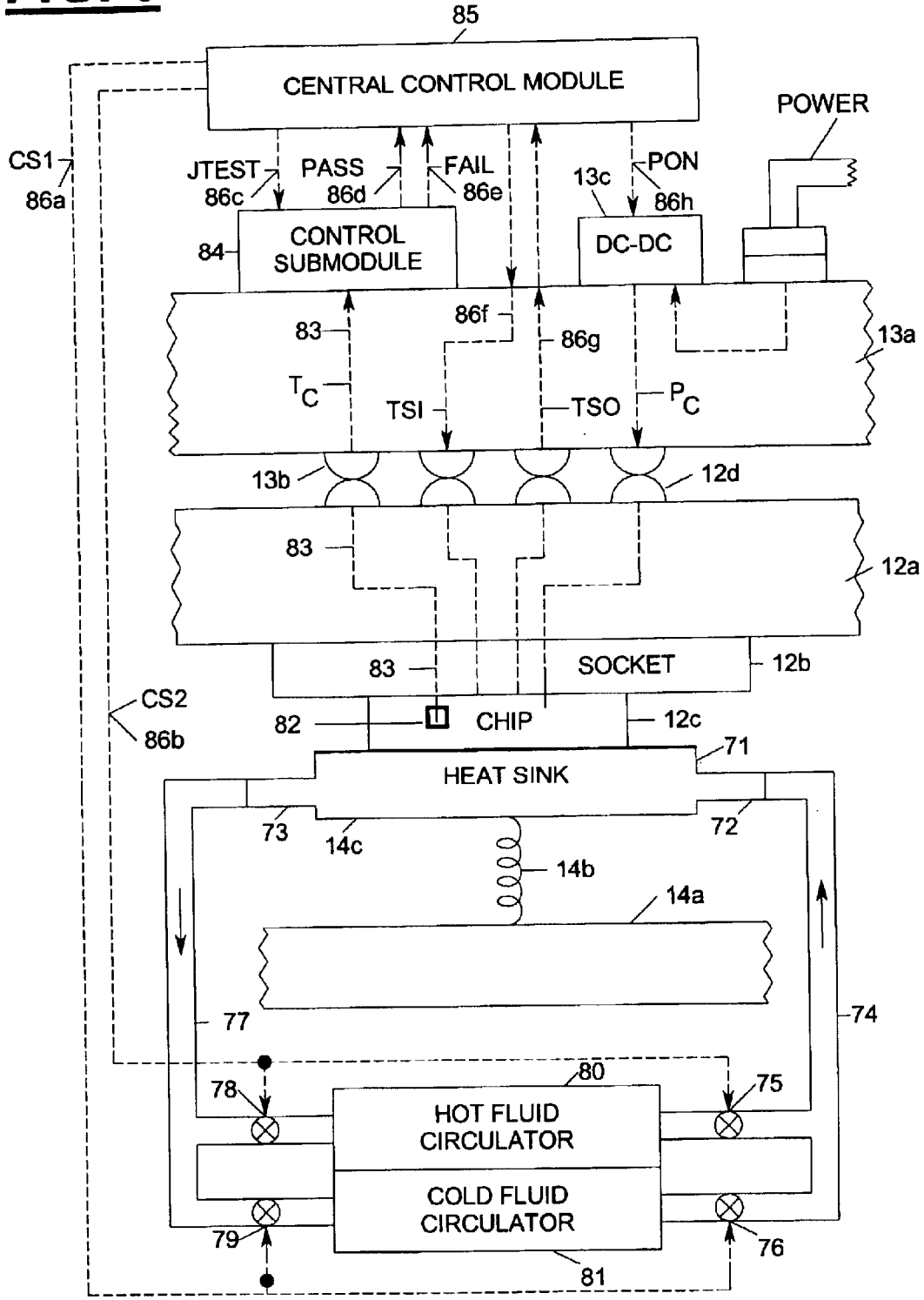
FIG. 8 shows a second modification that is incorporated into the prior art chip tester of FIGS. 1 and 2 which enables the present invention to be performed.

Next, with reference to FIGS. 8, 9 and 10, another version of the present invention will be described. To enable this particular version of the invention to be performed, the modification of FIG. 8 is incorporated into the prior art chip tester of FIGS. 1 and 2. All of the components that are in FIG. 8, but are not in FIGS. 1 and 2, are identified below in TABLE 3. All other components in FIG. 8 have the same reference numerals that they have in FIGS. 1 and 2.

TABLE 3

| NUMBER | COMPONENT |
| --- | --- |
| 71, 72, 73 | Component 71 is a hollow heatsink which has an input port 72 and an output port 73. |
| 74, 75, 76 | Component 74 is a conduit which carries fluid to the input port 72 of the heatsink 71. This conduit 74 has two input valves 75 and 76. |
| 77, 78, 79 | Component 77 is a conduit which carries fluid from the output port 73 of the heatsink 71. This conduit 74 has two output valves 78 and 79. |
| 80 | Component 80 is a means for circulating a hot fluid through components 74, 71, and 77 when the valves 75 and 78 are open. |
| 81 | Component 81 is a means for circulating a cold fluid through components 74, 71, and 77 when the valves 76 and 79 are open. |
| 82, 83 | Component 82 is an electronic temperature sensor which is integrated into the chip 12c. This sensor generates signals on conductors 83 which indicate the temperature $T_c$ of the chip 12c. |
| 84 | Component 84 is a control submodule which receives the chip temperature signals on the conductors 83, and performs various operations on those signals. These operations, which are described later, determine whether or not a defect exists in the pressed joint between the chip 12c and the heatsink 71. |
| 85 | Component 85 is a central control module for the entire tester of FIGS. 1, 2 and 8. |
| 86a–86h | Components 86a–86h are conductors which carry various signals, as shown in FIG. 8, to and from the central control module 85. |

To incorporate the components of TABLE 3 into the prior art tester of FIGS. 1 and 2, the heatsink 71, conductors 83, and control submodule 84 are repeated for each socket 12b on each printed circuit board 12a. Also, each chip 12c that is placed into a socket 12b must have its own temperature sensor 82.

In operation, the tester of FIGS. 1, 2 and 8 performs the following sequence of steps. First, the arms 15b are moved to the open position as shown in FIG. 1, and then each chip holding subassembly 12a–12d is placed in the tester between its corresponding power converter subassembly and corresponding temperature regulating subassembly. Next, the arms 15b are moved to the closed position, and in that position, each chip 12c forms a pressed joint with a heatsink 71. One such joint is shown in FIG. 8. Then, before any electrical power is applied to the chips 12c by the DC-DC converters 13c, a joint test is performed on each pressed joint between the chips 12c and the heatsink 71.

To start the above joint test, the central control module 85 first causes cold fluid to flow through each heatsink 71. This is achieved by sending a control signal CS1 to the valves 76 and 79 which causes those valves to open. The central control module 85 allows this cold fluid to flow for a time period which is at least long enough for the temperature of each heatsink 71 and the temperature of each chip 12c to reach a steady-state.

Next, the central control module 85 causes the temperature of the fluid that flows through each heatsink 71 to abruptly switch from cold to hot. This is achieved by stopping control signal CS1 to close the valves 76 and 79, and sending control signal CS2 to open the valves 75 and 78.

When the above switch from the cold fluid to the hot fluid begins, the central control module 85 sends a JTEST signal to each submodule 84 in the tester. In response, during a predetermined time interval that begins with the JTEST signal, each submodule 84 senses the amount by which the temperature of its corresponding chip 12c changes. This change in temperature is obtained by sampling the signals from sensor 82 at the beginning and end of the predetermined time interval, and subtracting the earlier sample from the later sample.

Next, each submodule 84 compares the above change in chip temperature that it sensed to a limit value. If the sensed change in chip temperature exceeds the limit value, then the submodule 84 sends a PASS signal back to the central control module 85. Otherwise, the submodule 84 sends the FAIL signal back to the central control module 85. Note that this is just the opposite of what the heater control module 31 does in FIG. 3.

When the submodule 84 for a particular chip sends the FAIL signal, then the central control module 85 does not send the PON signal to the DC-DC converter 13c for the chip. Conversely, when the submodule 84 for a particular chip 12c sends the PASS signal, then the central control module 85 proceeds to test that chip. To test the chip, the central control module 85 first sends the PON signal to the DC-DC converter 13c for the chip. In response, the DC-DC converter 13c sends electrical power $P_C$ to the chip. Thereafter, the central control module 85 sends the test signals TSI to the chip and receives the test signals TSO as a response.

Now, with reference to FIGS. 9 and 10, the technical principles on which the above joint test is based will be described. FIG. 9 is a thermodynamic schematic diagram of the chip 12c and the heatsink 71 in FIG. 8. All of the symbols which are in FIG. 8 are described below in TABLE 4.

TABLE 4

| SYMBOL | MEANING |
| --- | --- |
| $\theta_{SC}$ | This is the thermal resistance between the heatsink 71 and the chip 12c. |
| $M_C$ | This is the thermal mass of the chip 12c. |
| $P_{SC}$ | This is thermal power that is transferred between the heatsink 71 and the chip 12c. A positive value indicates that thermal power flows into the chip 12c; a negative value indicates that thermal power flows out of the chip 12c. |
| $T_C$ | This is the temperature of the chip 12c. |
| $T_S$ | This is the temperature of the heatsink 71. |
| $P_c$ | This is electrical power which is put into the chip 12c. This power equals zero during the above described joint test. |

In FIG. 10, equation 11 says that the thermal power $P_{SC}$ which is transferred from the heatsink 71 to the chip 12c equals the thermal mass of the chip 12c times the rate at which the chip temperature changes. Next, equation 12 of FIG. 10 is obtained by replacing $P_{SC}$ in equation 11 with an equivalent term, which is $(T_S-T_C) \div \theta_{SC}$.

Next, expression 13 of FIG. 10 says that when the heatsink temperature $T_S$ in equation 12 is kept at one constant level, then the chip temperature in equation 2 reaches a steady-state where it stays constant. By comparison, expression 14 of FIG. 10 says that when the heatsink temperature $T_S$ in equation 12 is abruptly increased from one constant level to a different level, then the chip temperature in equation 12 changes at a positive rate.

Suppose now that no defect exists in the pressed joint between the chip 12c and the heatsink 71 of FIGS. 8 and 9. In that case, the thermal resistance $\theta_{SC}$ in equation 12 will be relatively small. This is indicated by the arrow 91 in expression 15A.

Now, if $\theta_{SC}$ in equation 12 is small, then the power term. $(T_S-T_C) \div \theta_{SC}$ on the left side of equation 12 will be large. This is because the denominator of that power term is small.

If the left side of equation 12 is large, then the right side of equation 12 will also be large. Thus, the rate of change of chip temperature in the right side of equation 12 will be large. This is indicated by the arrow 92 in expression 15A.

Conversely, if a defect does exist in the pressed joint between the chip 12c and the heatsink 71, then the thermal resistance $\theta_{SC}$ in equation 12 will be relatively large. This is indicated by the arrow 93 in expression 15B. But if $\theta_{SC}$ in equation 12 is large, then the power term $(T_S-T_C) \div \theta_{SC}$ on the left side of equation 12 will be small because the denominator of that power term is large. Consequently, the rate of change of chip temperature in the right side of equation 12 will be small, and this is indicated by the arrow 94 in expression 15B.

To visually see how chip temperature $T_C$ changes in the above described method of FIGS. 8–10, reference should be made back to curves 52 and 53 of FIG. 6. If the pressed joint in the method of FIGS. 8–10 is non-defective, then the chip temperature will change quickly like curve 52. Conversely, if the pressed joint in the method of FIGS. 8–10 is defective, then the chip temperature will change slowly like curve 53.

Preferably, the time t1+Δt at which the chip temperature $T_C$ is sensed for the method of FIGS. 8–10 occurs when the difference between $T_C$ for a non-defective joint and $T_C$ for a defective joint is at or near a maximum value. Time t1 is when the fluid through the heatsink switches from the cold fluid to the hot fluid.

Now, one variation that can be incorporated into the central control module 35 of FIG. 8 is as follows. In the above description, the central control module 85 operates to abruptly switch the temperature of the fluid which flows through each heatsink 71 from cold to hot. However, as an alternative, the control module 85 can abruptly switch the temperature of fluid which flows through each heatsink from hot to cold. All other steps which are performed by the FIG. 8 modification, as described above, remain unchanged.

Next, with reference to FIG. 11, still another version of the present invention will be described. All of the components in FIG. 11 are the same as the components in FIG. 8, except for the following changes.

Figure 11:
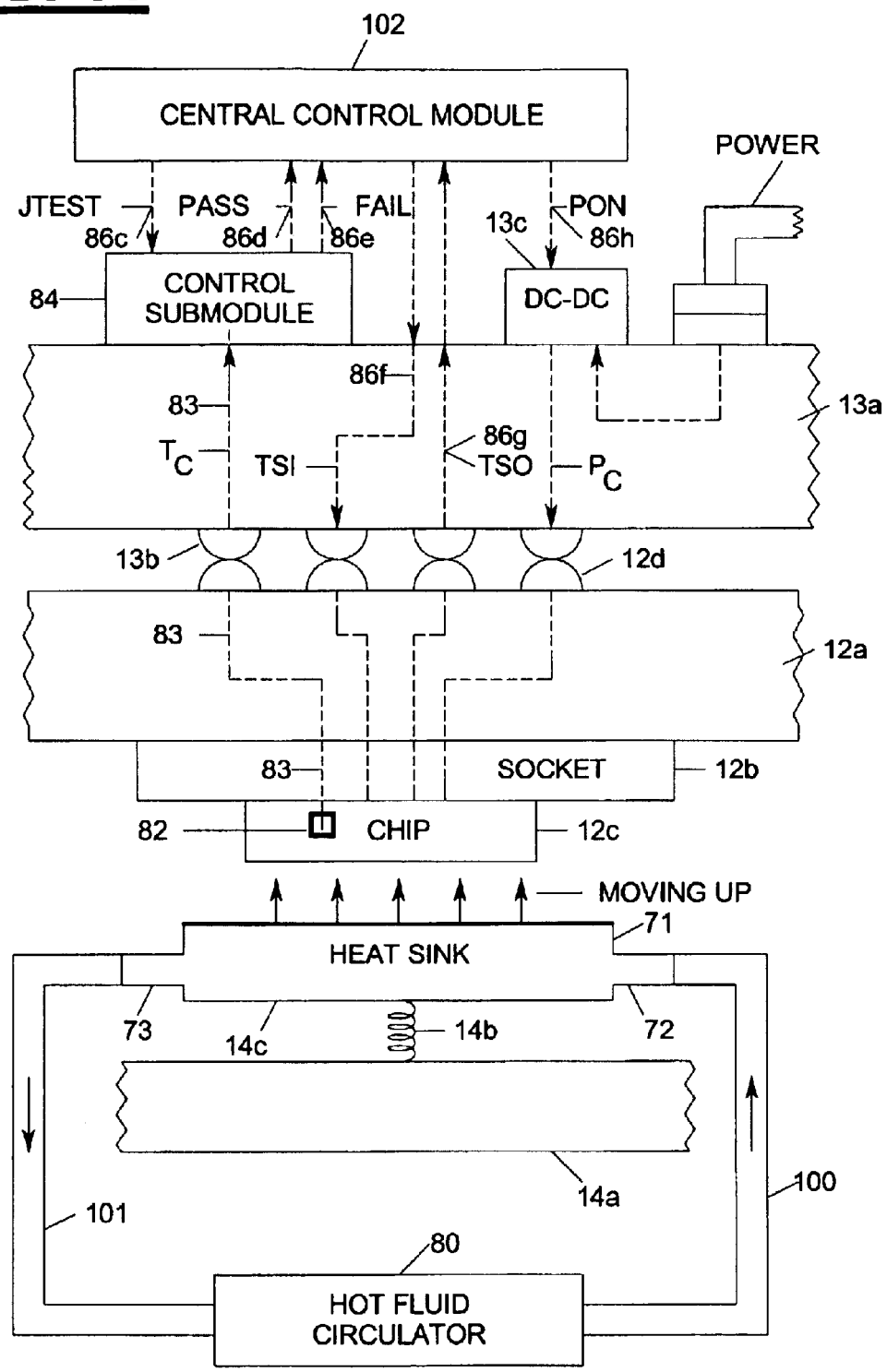
FIG. 11 shows a third modification that is incorporated into the prior art chip tester of FIGS. 1 and 2 which enables the present invention to be performed.

First, in FIG. 11, the fluid is passed through each heatsink 71 at a single constant temperature. This is achieved by: a) retaining the hot fluid circulator 80 of FIG. 8, b) eliminating the cold fluid circulator 81 of FIG. 8, and c) replacing the conduits and valves 74–79 of FIG. 8 with more simplified conduits 100 and 101.

Second, in FIG. 11, the central control module 102 does not generate the control signals CS1 and CS2, as does the central control module 85 of FIG. 8. Also in FIG. 11, the central control module 102 generates the JTEST signal upon the occurrence of an entirely different event, in comparison to the central control module 85 of FIG. 8. In particular, the central control module 102 generates the JTEST signal when the heatsink 71 makes initial contact with the chip 12c.

To incorporate the components of FIG. 11 into the prior art tester of FIGS. 1 and 2, the heatsink 71, conductors 83, and control submodule 84 are repeated for each socket 12b on each printed circuit board 12a. Also, each chip 12c that is placed into a socket 12b must have its own temperature sensor 82.

In operation, the tester of FIGS. 1, 2 and 11 performs the following sequence of steps. First, the arms 15b are moved to the open position as shown in FIG. 1, and then each chip holding subassembly 12a–12d is placed in the tester between its corresponding power converter subassembly and corresponding temperature regulating subassembly.

Next, while the arms 15b are in the open position, the hot fluid is passed through each heatsink 71 by components 80, 100 and 101. This occurs for a time period which is at least long enough for each heatsink 71 to reach a hot steady-state temperature that is caused by the hot fluid, and for each chip 12c to reach a cooler steady-state temperature that is caused by the surrounding air.

Next, the arms 15b are moved to the closed position as shown in FIG. 2, and the central control module 102 sends the JTEST signal to each submodule 84 when the heatsinks 71 initially contact the chips 12c. In response, during a predetermined time interval that begins with the JTEST signal, each submodule 84 senses the amount by which the temperature of its corresponding chip 12c changes. This change in temperature is obtained by sampling the signals from sensor 82 at the beginning and end of the predetermined time interval, and subtracting the earlier sample from the later sample.

Next, each submodule 84 compares the above change in chip temperature that it sensed to a limit value. If the sensed change in chip temperature exceeds the limit value, then the submodule 84 sends a PASS signal back to the central control module 102. Otherwise, the submodule 84 sends the FAIL signal back to the central control module 102.

When the submodule 84 for a particular chip sends the FAIL signal, then the central control module 102 does not send the PON signal to the DC-DC converter 13c for the chip. Conversely, when the submodule 84 for a particular chip 12c sends the PASS signal, then the central control module 102 sends the PON signal to the DC-DC converter 13c for the chip and proceeds to test the chip.

The technical principles on which the above joint test is based will now be explained with reference to FIG. 9. That figure accurately represents the heatsink 71 and chip 12c of FIG. 11 as soon as those two components initially contact each other. When initial contact occurs, the heatsink 71 will be hotter than the chip 12c, and so thermal power $P_{SC}$ will flow to the chip 12c through the thermal resistance $\theta_{SC}$. If $\theta_{SC}$ is small, the $P_{SC}$ will be large, and consequently the temperature of the chip 12c will rise quickly. Conversely, if $\theta_{SC}$ is large, then $P_{SC}$ will be small, and consequently the temperature of the chip 12c will rise slowly.

To visually see how chip temperature $T_C$ changes in the above described method of FIG. 11, reference should be made back to curves 52 and 53 of FIG. 6. If the pressed joint in the method of FIG. 11 is non-defective, then the chip temperature will change quickly like curve 52. Conversely, if the pressed joint in the method of FIG. 11 is defective, then the chip temperature will change slowly like curve 53.

Preferably, the time $t1+\Delta t$ at which the chip temperature $T_C$ is sensed for the method of FIG. 11 occurs when the difference between $T_C$ for a non-defective joint and $T_C$ for a defective joint is at or near a maximum value. Time t1 is when the heatsink 71 initially contacts the chip 12c.

Next, with reference to FIG. 12, yet another version of the present invention will be described. All of the components in FIG. 12 are the same as the components in FIG. 3, except for the following changes.

Figure 12:
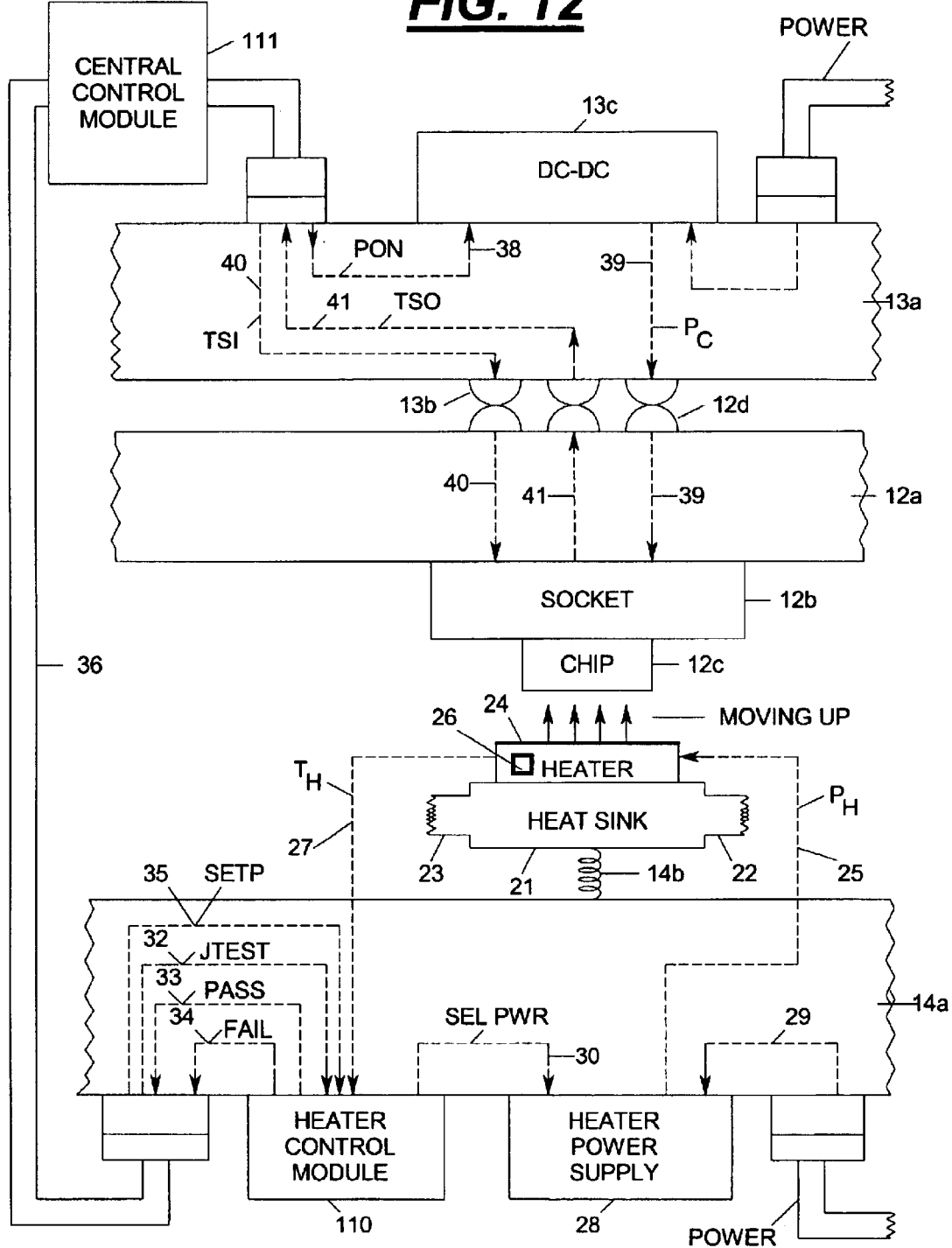
FIG. 12 shows a fourth modification that is incorporated into the prior art chip tester of FIGS. 1 and 2 which enables the present invention to be performed.

First, the heater control module 110 of FIG. 12 does not respond to the JTEST signal in the same way that the heater control module 31 of FIG. 3 responds. Recall that the heater control module 31 of FIG. 3 responds to the JTEST signal by directing the heater power supply 28 to send electrical power to the heater 24 with a magnitude that is initially constant at one level and then abruptly changes to a different constant level. By comparison, the heater control module 110 of FIG. 12 responds to the JTEST signal by maintaining the heater power at a constant level, which is the amount of power that is being sent when the JTEST signal is initially received.

Second in FIG. 12, the central control module 111 generates the JTEST signal upon the occurrence of an entirely different event, in comparison to the central control module 37 in FIG. 3. In particular, the central control module 111 generates the JTEST signal when the heater 24 makes initial contact with the chip 12c.

To incorporate the components of FIG. 12 into the prior art tester of FIGS. 1 and 2, the heater control module 110 as well as the other previously described components 21–30, 32–35, and 38–41 are repeated for each socket 12b on each printed circuit board 12a. Then, in operation, the tester of FIGS. 1, 2 and 12 performs the following steps.

First, the arms 15b are moved to the open position as shown in FIG. 1, and then each chip holding subassembly 12a–12d is placed in the tester between its corresponding power converter subassembly and corresponding temperature regulating subassembly. Next, while the arms 15b are in the open position, the central control module 111 sends the SETP temperature signals to each heater control module 110. In response, each heater control module 110 operates in the previously described normal mode which forces the temperature of the heater to the set point. While this is occurring, each chip 12c reaches a cooler steady-state temperature that is caused by the surrounding air.

Next, the arms 15b are moved to the closed position as shown in FIG. 2, and the central control module 111 sends the JTEST signal to each submodule 110 when the heaters 24 initially contact the chips 12c. In response, during a predetermined time interval that begins with the JTEST signal, each heater control module 110 keeps the power level to its heater 24 constant, and senses the amount by which the temperature of its corresponding heater 24 changes. This change in temperature is obtained by sampling the signals from the sensor 26 at the beginning and end of the predetermined time interval, and subtracting the earlier sample from the later sample.

Next, each heater control module 110 compares the above change in heater temperature that it sensed to a limit value. If the sensed change in heater temperature exceeds the limit value, then the heater control module 110 sends a PASS signal back to the central control module 111; otherwise it sends a FAIL signal. Note that this is the opposite of what is done by the heater control module 31 of FIG. 3.

When the heater control module 110 for a particular chip sends the FAIL signal, then the central control module 111 does not send the PON signal to the DC-DC converter 13c for the chip. Conversely, when the heater control module 110 for a particular chip 12c sends the PASS signal, then the central control module 111 sends the PON signal to the DC-DC converter 13c for the chip and proceeds to test the chip. During this testing, each heater control module 110 operates in the normal mode.

The technical principles on which the above joint test is based will now be explained with reference to FIG. 4. That figure accurately represents the heater 24 and chip 12c of FIG. 12 as soon as those two components initially contact each other. When initial contact occurs, the heater 24 will be hotter than the chip 12c, and so thermal power $P_{HC}$ will flow to the chip 12c through the thermal resistance $\theta_{HC}$. If $\theta_{HC}$ is small, then $P_{HC}$ will be large, and consequently the temperature of the heater 24 will drop quickly. Conversely, if $\theta_{HC}$ is large, then $P_{HC}$ will be small, and consequently the temperature of the heater 24 will drop slowly.

To visually see how heater temperature $T_H$ changes in the above described method of FIG. 12, reference should be made back to curves 52 and 53 of FIG. 6. If the pressed joint in the method of FIG. 12 is non-defective, then the heater temperature will change quickly like curve 52. Conversely, if the pressed joint in the method of FIG. 12 is defective, then the heater temperature will change slowly like curve 53.

Preferably, the time t1+Δt at which the heater temperature $T_H$ is sensed for the method of FIG. 12 occurs when the difference between $T_H$ for a non-defective joint and $T_H$ for a defective joint is at or near a maximum value. Time t1 is when the heater 24 initially contacts the chip 12c.

One variation that can be incorporated into the heater control module 110 of FIG. 12 is as follows. In the above description, the heater control module 110 responds to the JTEST signal by maintaining the heater power at a constant level which is the amount of power that is being sent when the JTEST signal is received. However, as a modification, the heater control module 110 can be simplified by having it always operate in the normal mode. With this modification, the heater control module 110 responds to the JTESTS signal by simply taking two temperature samples from the sensor 26, and generating the PASS/FAIL signals, as described above.

Also, if the heater control module 111 always operates in the normal mode, then the change in heater temperature can be sensed indirectly by monitoring a corresponding change in the heater power $P_H$. In the normal mode, the heater control module 110 attempts to keep the heater 24 at the set point temperature. But, when the hot heater 24 and the cold chip 12c are initially pressed together, the temperature of the heater 24 decreases because thermal power is transferred from the heater 24 to the chip 12c. In response to this decrease in heater temperature, the heater control module 111 which is operating in the normal mode will increase the heater power $P_H$.

If $\theta_{HC}$ is small, then the heater temperature decreases at a fast rate, and so the increase in the heater power $P_H$ is large. This is shown by curve 120 in FIG. 13. Conversely, if $\theta_{HC}$ is large, then the heater temperature decreases at a slow rate, and so the increase in heater power $P_H$ is small. This is shown by curve 121 in FIG. 13.

Figure 13:
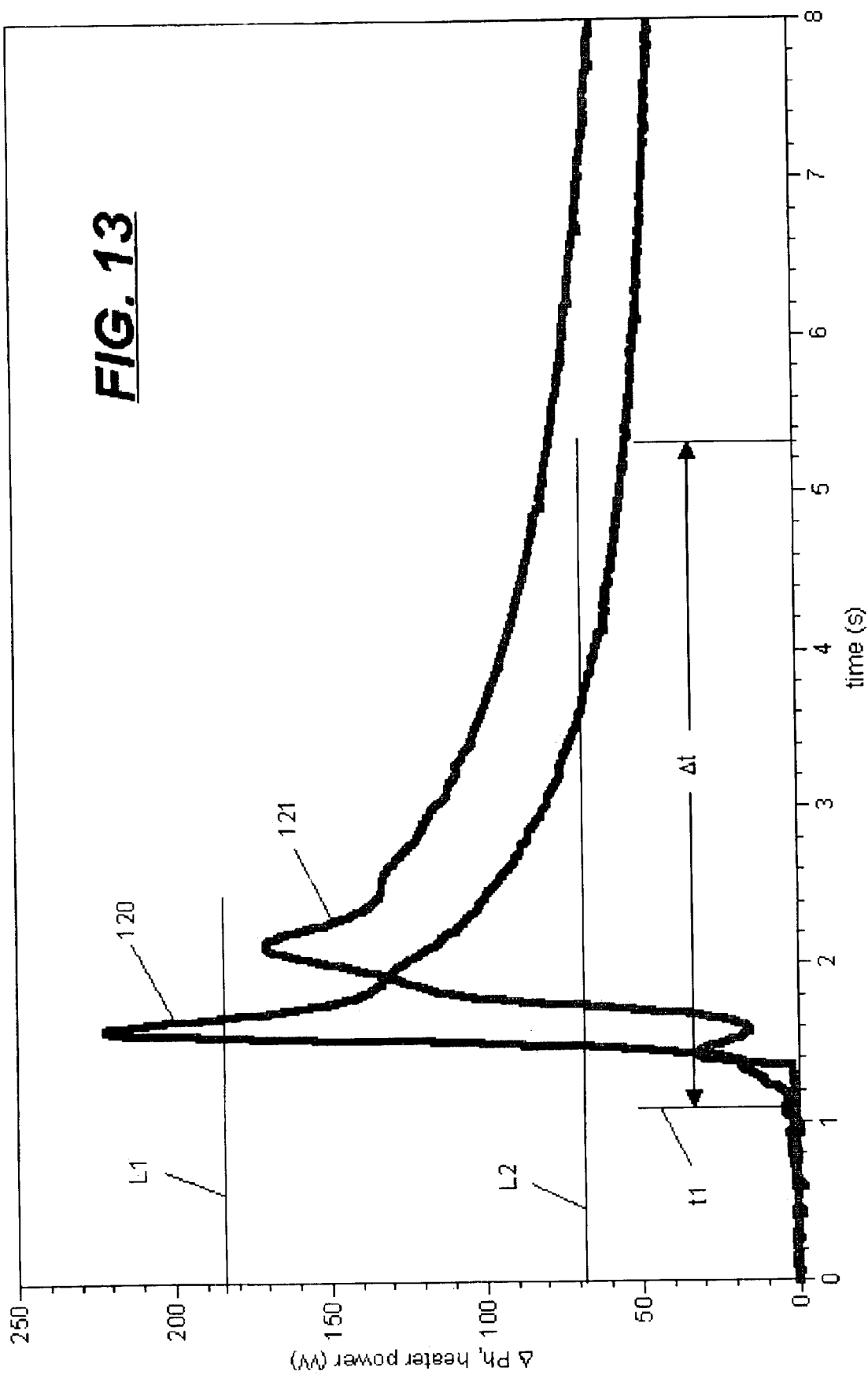
FIG. 13 is a set of curves that graphically illustrates one particular mode of operation for the FIG. 12 modification.

If the heater power $P_H$ stays below a predetermined limit L1 during time interval Δt in FIG. 13, then this indicates that the pressed joint is defective. Alternatively, if the heater power is above a predetermined limit L2 at the end of the time interval Δt in FIG. 13, then this indicates that the pressed joint is defective. In FIG. 13, t1 is when the heater 24 initially contacts the chip 12c.

Similarly, the heater control module 31 which was previously described in conjunction with FIG. 3, can be modified to always operate in the normal mode. With this modification, the heater control module receives one SETP signal and subsequently receives a different SETP signal in order to abruptly change the heater temperature from one set point temperature to another.

If $\theta_{HC}$ is small, then a large amount of thermal power will be transferred to the chip 12c, and so the initial increase in heater power will be large. Conversely, if $\theta_{HC}$ is large, a small amount of thermal power will be transferred to the chip 12c and so the initial increase in heater power will be small. After the above initial increase in heater power, the heater power will taper off to a steady-state. Here again, the change in heater temperature can be sensed indirectly by monitoring a corresponding change in the heater power $P_H$.

Several preferred methods of preventing a chip from being thermally destroyed in tester, due to a defective pressed joint, have now been described in detail. Based on the insight that is acquired from all of these methods, it should be apparent that various minor modifications can be made to the described details without departing from the gist of the present invention.

For example, the methods that are described above in conjunction with FIGS. 3, 8, 11 and 12 can be performed by a tester that employs any suitable pressing mechanism, and not just the pressing mechanism of FIGS. 1 and 2, to form the pressed joint with the chip 12c. Also the methods that are described above in conjunction with FIGS. 3, 8, 11 and 12 can be performed by a tester which operates on just a single chip 12c at a time. Further, after a pressed joint is found to be non-defective by the methods of FIGS. 3, 8, 11 and 12, the tester can proceed by performing a test which doesn't apply any TSI signals to the chip but only applies electrical power to the chip.

Also in the methods that are described above in conjunction with FIGS. 6 and 7, the change in heater temperature $T_H$, or change in chip temperature $T_C$, is sensed by sampling those temperatures at time t1 and time t1+Δt. Then, a fast rate of change is indicated by the difference between the two samples having a magnitude that exceeds a predetermined limit, and vice-versa. However as an alternative, the rate of change of $T_H$ or $T_C$ can be sensed by measuring the amount of time that passes from time t1 to the time that it takes for $T_H$ or $T_C$ to reach a predetermined temperature which is between the steady-state temperatures that occur at times t1 and t2.

Accordingly, it is to be understood that the present invention is not limited to just the above described details, but is defined by the appended claims.

What is claimed is:

1. A method of preventing the thermal destruction of a integrated circuit chip in a tester which includes a temperature regulating component for contacting said chip through a pressed joint, which could be defective; said method including the steps of:

maintaining said chip at one temperature while forcing said temperature regulating component to a different temperature, when said chip and said temperature regulating component are spaced apart in said tester and no electrical power is applied to said chip;

pressing said temperature regulating component at said one temperature against said chip at said different temperature;

sensing a temperature change in either said temperature regulating component or said chip, that occurs in response to said temperature regulating component being pressed against said chip; and, applying electrical power to said chip in said tester only if said temperature change, which is sensed by said sensing step, meets a predetermined criteria.

2. A method according to claim 1 wherein said sensing step is performed by an electronic sensor in said chip.

3. A method according to claim 2 wherein said predetermined criteria in said applying step is that said temperature change occurs at a rate which is larger than a predetermined limit.

4. A method according to claim 3 wherein said step of forcing said temperature regulating component to a different temperature is performed by including a hollow heatsink in said temperature regulating component and passing a fluid at said different temperature through said hollow heatsink.

5. A method according to claim 3 wherein said step of forcing said temperature regulating component to a different temperature is performed by including an electric heater in said temperature regulating component and sending electric power at a constant level to said heater.

6. A method according to claim 3 wherein said step of forcing said temperature regulating component to a different temperature forces said temperature regulating component to be hotter than said chip.

7. A method according to claim 3 wherein said step of forcing said temperature regulating component to a different temperature forces said temperature regulating component to be colder than said chip.

8. A method according to claim 1 wherein said sensing step is performed by an electronic sensor in said temperature regulating component.

9. A method according to claim 8 wherein said predetermined criteria in said applying step is that said temperature change occurs at a rate which is larger than a predetermined limit.

10. A method according to claim 9 wherein said step of forcing said temperature regulating component to a different temperature is performed by including an electric heater in said temperature regulating component and sending electric power to said heater.

11. A method according to claim 10 wherein said electric power to said heater stays constant throughout said sensing step.

12. A method according to claim 10 wherein said electric power to said heater changes during said sensing step in a manner which tries to maintain the temperature of said heater at a set point.

13. A method according to claim 12 wherein said change in power to said heater is used by said electronic sensor to indicate said temperature change in said temperature regulating component.

14. A method according to claim 1 wherein said sensing step includes the substeps of: 1) sampling the temperature of said temperature regulating component, or said chip, at the beginning and the end of a fixed predetermined time interval, and 2) using the absolute value of the difference between the samples from substep 1 to indicate said temperature change in said applying step.

15. A method according to claim 1 wherein said sensing step includes the substeps of: 1) measuring the amount of time that passes from said abrupt change in thermal power to the time that it takes for the temperature of said temperature regulating component, or said chip, to reach a fixed predetermined value, and 2) using the measured amount of time from substep 1 to indicate said temperature change in said applying step.

* * * * *